United States Patent
Zolnowski

(10) Patent No.: US 6,590,283 B1
(45) Date of Patent: Jul. 8, 2003

(54) METHOD FOR HERMETIC LEADLESS DEVICE INTERCONNECT USING A SUBMOUNT

(75) Inventor: Dennis Ronald Zolnowski, Bridgewater, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/513,634

(22) Filed: Feb. 28, 2000

(51) Int. Cl.⁷ .......................... H01B 17/26; H01H 1/02; H01L 21/30; H01L 29/40
(52) U.S. Cl. ..................... 257/698; 257/492; 257/693; 257/690; 257/668; 257/774; 257/491; 257/700; 257/701; 438/123; 438/612; 438/106; 438/124; 438/613; 438/614; 174/265; 228/124.5
(58) Field of Search ................ 438/123, 612–614, 438/106, 124; 257/778, 738, 737, 777, 686, 692, 693, 690; 759/774, 691, 668; 174/265; 228/124.5

(56) References Cited

U.S. PATENT DOCUMENTS

| | | | | |
|---|---|---|---|---|
| 4,639,631 A | * | 1/1987 | Chason et al. .............. 310/344 |
| 4,825,284 A | * | 4/1989 | Soga et al. | |
| 4,984,358 A | * | 1/1991 | Nelson ......................... 29/830 |
| 5,234,149 A | * | 8/1993 | Katz et al. ................ 228/123.1 |
| 5,249,733 A | * | 10/1993 | Brady et al. ........... 228/180.22 |
| 5,375,042 A | * | 12/1994 | Arima et al. ................ 257/686 |
| 5,448,014 A | * | 9/1995 | Kong et al. ..................... 29/832 |
| 5,454,161 A | * | 10/1995 | Beilin et al. ................... 29/852 |
| 5,569,958 A | * | 10/1996 | Bloom ........................ 257/698 |
| 5,747,363 A | * | 5/1998 | Wei et al. ........................ 438/5 |
| 5,750,926 A | * | 5/1998 | Schulman et al. ........... 257/698 |
| 5,763,059 A | * | 6/1998 | Yamaguchi et al.. ......... 428/209 |
| 5,764,485 A | * | 6/1998 | Lebaschi .................... 257/779 |
| 5,770,473 A | * | 6/1998 | Hall et al. ..................... 438/26 |
| 5,866,442 A | * | 2/1999 | Brand ........................ 438/108 |
| 5,870,289 A | * | 2/1999 | Tokuda et al. .............. 361/779 |
| 5,898,218 A | * | 4/1999 | Hirose et al. ................ 257/710 |
| 5,937,321 A | * | 8/1999 | Beck et al. .................. 438/622 |
| 5,994,763 A | * | 11/1999 | Ohmuro ...................... 257/621 |
| 6,118,177 A | * | 9/2000 | Lischner et al. ............ 257/706 |
| 6,126,428 A | * | 10/2000 | Mitchell et al. ............. 425/110 |
| 6,146,917 A | * | 11/2000 | Zhang et al. .................. 438/51 |
| 6,228,675 B1 | * | 5/2001 | Ruby et al. .................. 438/106 |
| 6,265,673 B1 | * | 7/2001 | Higashida et al. .......... 361/783 |
| 2001/0021570 A1 | * | 9/2001 | Lin et al. ..................... 438/455 |

FOREIGN PATENT DOCUMENTS

JP          59-30470        *    2/1984

* cited by examiner

Primary Examiner—Alexander O. Williams
(74) Attorney, Agent, or Firm—Lowenstein Sandler PLC

(57) ABSTRACT

In accordance with the invention, a semiconductor device having an electrical input/output contact surface is hermetically sealed and provided with connections via a submount such as a two-level ceramic substrate. The device is provided with a contact surface having a sealable peripheral contact and one or more interior contacts. The submount is provided with a peripheral sealable contact corresponding to the device peripheral contact and one or more feed-through contacts corresponding to the device interior contacts. The sealable peripheral contacts surround the interior contacts providing heremetic sealing.

3 Claims, 1 Drawing Sheet

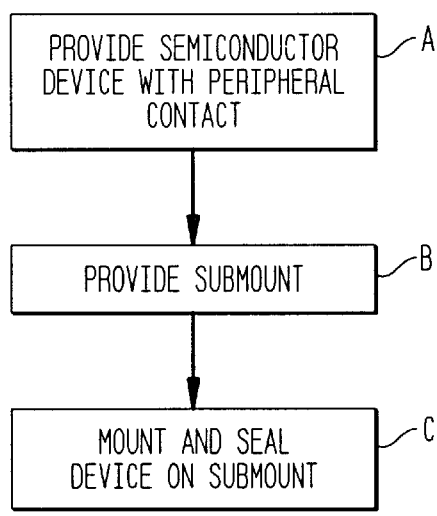
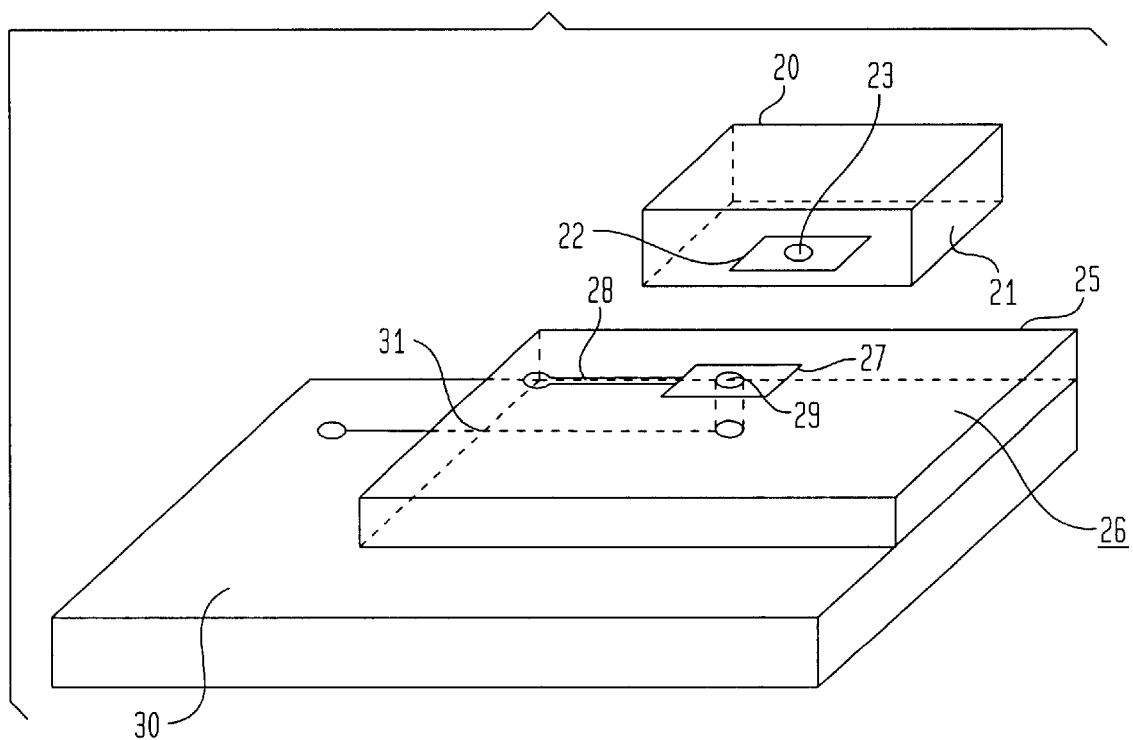

METHOD FOR HERMETIC LEADLESS DEVICE INTERCONNECT USING A SUBMOUNT

FIELD OF THE INVENTION

This invention relates to methods for connecting semiconductor devices onto substrates and, in particular, to a method particularly useful for connecting devices requiring hermetic sealing.

BACKGROUND OF THE INVENTION

In the fabrication of practical electronic circuits, semiconductor devices are connected to leads on a substrate such as an insulating ceramic. Such connections need to be made with minimal electrical impedance, minimal thermal impedance, and with hermetic sealing of the interconnect region. Resistive and inductive impedance limit speed. Thermal impedance limits power, and moisture limits operating life.

High performance devices such as avalanche and PIN photodiodes are typically sealed within metal or ceramic packages in a controllable gaseous ambient. In a typical arrangement, a planar avalanche photodiode (APD) is mounted within a ceramic package over an opening to provide back-illumination of the diode. The ceramic package is then sealed in an inert gas ambient by a metal lid. This process is quite expensive.

Accordingly there is a need for an improved method of mounting and interconnecting semiconductor devices.

SUMMARY OF THE INVENTION

In accordance with the invention, a semiconductor device having an electrical input/output contact surface is hermetically sealed and provided with connections via a submount such as a two-level ceramic substrate. The device is provided with a contact surface having a sealable peripheral contact and one or more interior contacts. The submount is provided with a sealable peripheral contact corresponding to the device peripheral contact and one or more feed-through contacts corresponding to the device interior contacts. The sealable peripheral contacts surround the interior contacts to provide heremetic sealing.

BRIEF DESCRIPTION OF THE DRAWINGS

The nature, advantages and various additional features of the invention will appear more fully upon consideration of the illustrative embodiments now to be described in detail in the accompanying drawings. In the drawings:

FIG. 1 is a flow diagram illustrating the steps in connecting and sealing a semiconductor device in accordance with the invention;

FIG. 2 is an exploded view of a semiconductor device mounted on a submount in accordance with the process of FIG. 1.

It is to be understood that these drawings are for illustrating the concepts of the invention and are not to scale.

DETAILED DESCRIPTION

Referring to the drawings, FIG. 1 is a flow diagram illustrating the steps involved in hermetically connecting a semiconductor device onto a submount. The first step, shown in Block A, is to provide a semiconductor device having an electrical input/output surface including a sealable peripheral contact and one or more interior contacts. The surface is advantageously planar, and the peripheral contact forms on the plane a closed figure, e.g. a rectangular frame, around the interior contacts.

FIG. 2 shows a semiconductor device 20 having a planar surface 21 upon which are formed a peripheral contact 22 and an interior contact 23. The contacts 22, 23 typically comprise coated gold. The device 20 can be one which requires hermetic sealing of the region interior to the peripheral contact 22 such as an avalanche photodiode or a PIN photodiode.

The next step shown in Block B is to provide a submount for receiving the device. The submount comprises an insulating body with a mounting surface including a sealable peripheral contact corresponding in size to the device peripheral contact and one or more interior feed-through contacts corresponding in position to the device interior contacts. The submount is advantageously a two-layer ceramic substrate presenting a lead to the peripheral contact on one level and a lead to the interior feed-through contact on a second level.

FIG. 2 further illustrates a submount comprising a two level insulating body 25 having as a first level planar mounting surface 26. On surface 26 are a sealable peripheral contact 27 for sealing with device peripheral contact 22, a lead 28 to contact 27 and an interior feed-through contact 29 for electrically contacting device interior contact 23. The feed-through contact extends between surface 26 and a second level 30 for contacts. The second level includes a lead 31 providing access to the interior feed-through contact 29.

The third step (Block C of FIG. 1) is to mount and hermetically seal the semiconductor device on the submount. Advantageously, solder is coated on at least one contact of each mating pair e.g. 22, 27 and 23, 29. The device is positioned and heated so that the mating pairs align and solder bond onto the submount. Sealable contacts 22, 27 and submount body 25 hermetically seal the portion of device 20 interior to the peripheral contact 22. Lead 28 provides access to device contact 22 via submount contact 27. Lead 31 provides access to device interior contact 23 via through-contact 29.

The soldering is advantageously carried out in a controlled ambient, such as argon or dry nitrogen, to protect the active (contact) surface of the device from water vapor and other atmospheric contaminants. The solder can be a gold-tin solder.

This method provides a low cost mounting of the device on the submount suitable for both hermetic and non-hermetic applications. If the device is a photodiode, the photodiode can readily be back illuminated through the major surface parallel to the contact surface. The device on submount can be attached directly to a larger silicon die. And since the design is flip chip in nature, yield loss due to wire bonding over the active surface is avoided.

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed is:

1. A method of hermetically sealing and providing with electrical connections a semiconductor device having an electrical input/output contact surface including at least one contact in a region to be sealed comprising the steps of:

providing the device with a sealable peripheral contact around the region to be sealed;

providing a submount for receiving the device, the submount comprising an insulating body having a first level including mounting contact surface and a second level, the mounting contact surface including a sealable peripheral contact corresponding to the device peripheral contact and a feed-through electrical contact to the second level corresponding to the contact to be sealed; and soldering the device on the submount so that the device sealable peripheral contact seals with the submount peripheral contact and the device interior contact connects with the submount feed-through contact.

2. The method of claim 1 wherein the submount first level includes a lead to the sealable peripheral contact on the mounting surface and the submount second level includes a lead to the feed-through contact.

3. The method of claim 1 wherein the soldering is carried out in a dry inert gaseous ambient.

* * * * *